United States Patent
Fujisawa et al.

(10) Patent No.: US 11,027,458 B2
(45) Date of Patent: Jun. 8, 2021

(54) PREPREG, METAL-CLAD LAMINATE, PRINTED WIRING BOARD, AND METHOD FOR PRODUCING PREPREG

(71) Applicant: Panasonic Intellectual Property Management Co., Ltd., Osaka (JP)

(72) Inventors: Hiroyuki Fujisawa, Fukushima (JP); Kenichi Toshimitsu, Fukushima (JP); Yoshihiko Nakamura, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 345 days.

(21) Appl. No.: 16/082,318

(22) PCT Filed: Feb. 15, 2017

(86) PCT No.: PCT/JP2017/005477
§ 371 (c)(1),
(2) Date: Sep. 5, 2018

(87) PCT Pub. No.: WO2017/163674
PCT Pub. Date: Sep. 28, 2017

(65) Prior Publication Data
US 2019/0084188 A1    Mar. 21, 2019

(30) Foreign Application Priority Data

Mar. 23, 2016  (JP) .............................. JP2016-059030

(51) Int. Cl.
| | | |
|---|---|---|
| *B32B 27/20* | (2006.01) | |
| *B32B 7/00* | (2019.01) | |
| *C08J 5/24* | (2006.01) | |
| *B29B 15/12* | (2006.01) | |
| *H05K 1/03* | (2006.01) | |
| *B32B 5/02* | (2006.01) | |
| *B32B 5/26* | (2006.01) | |
| *B32B 5/28* | (2006.01) | |
| *B32B 17/04* | (2006.01) | |
| *B32B 27/38* | (2006.01) | |

(52) U.S. Cl.
CPC .......... *B29B 15/125* (2013.01); *B29B 15/122* (2013.01); *B32B 5/024* (2013.01); *B32B 5/26* (2013.01); *B32B 5/28* (2013.01); *B32B 17/04* (2013.01); *C08J 5/24* (2013.01); *H05K 1/03* (2013.01); *H05K 1/036* (2013.01); *H05K 1/0366* (2013.01); *H05K 1/0373* (2013.01); *B32B 2260/046* (2013.01); *B32B 2262/101* (2013.01); *B32B 2264/107* (2013.01); *C08J 2363/04* (2013.01); *C08J 2363/10* (2013.01); *C08J 2463/04* (2013.01); *C08J 2463/10* (2013.01); *H05K 2201/0195* (2013.01); *H05K 2201/0209* (2013.01); *H05K 2201/0269* (2013.01); *H05K 2203/166* (2013.01)

(58) Field of Classification Search
None
See application file for complete search history.

(56) References Cited

U.S. PATENT DOCUMENTS

| | | | |
|---|---|---|---|
| 2002/0085888 A1 | 7/2002 | Velpari et al. | |
| 2005/0208301 A1* | 9/2005 | Okamoto | H01B 3/006 428/402 |
| 2010/0248569 A1* | 9/2010 | Peng | H05K 1/0366 442/31 |
| 2011/0204409 A1* | 8/2011 | Sung | H05K 1/0203 257/99 |
| 2016/0247595 A1* | 8/2016 | Song | C09J 7/20 |
| 2017/0218171 A1* | 8/2017 | Leach | H05K 1/0373 |
| 2017/0291332 A1* | 10/2017 | Braley | B29C 43/003 |

FOREIGN PATENT DOCUMENTS

| | | |
|---|---|---|
| JP | 2003-524302 A | 8/2003 |
| WO | 2013/076972 A1 | 5/2013 |
| WO | 2013/140812 | 9/2013 |

OTHER PUBLICATIONS

International Search Report of PCT application No. PCT/JP2017/005477 dated May 9, 2017.

* cited by examiner

*Primary Examiner* — Michael J Feely
(74) *Attorney, Agent, or Firm* — McDermott Will and Emery LLP

(57) ABSTRACT

The prepreg includes a first resin layer and a second resin layer disposed on both surfaces of the first resin layer. The first resin layer is a half-cured product of a first resin composition that includes a glass cloth impregnated with the first resin composition and contains no hexagonal boron nitride. The second resin layer is a half-cured product of a second resin composition containing hexagonal boron nitride. The glass cloth has a warp and weft weave density of 54 pieces/25 mm or more. The hexagonal boron nitride has an average particle size ranging from 10 μm to 30 μm. The hexagonal boron nitride is contained in an amount ranging from 20 parts by mass to 40 parts by mass relative to 100 parts by mass of a residual component other than the hexagonal boron nitride in the second resin composition.

6 Claims, 6 Drawing Sheets

PREPREG, METAL-CLAD LAMINATE, PRINTED WIRING BOARD, AND METHOD FOR PRODUCING PREPREG

This application is a U.S. national stage application of the PCT International Application No. PCT/JP2017/005477 filed on Feb. 15, 2017, which claims the benefit of foreign priority of Japanese patent application No. 2016-059030 filed on Mar. 23, 2016, the contents all of which are incorporated herein by reference.

FIELD OF THE INVENTION

The present disclosure relates to a prepreg, a metal-clad laminate, a printed wiring board, and a method for producing a prepreg and relates in more detail to a prepreg, a metal-clad laminate, a printed wiring board, and a method for producing a prepreg that are compatible with high-frequency waves.

DESCRIPTION OF THE RELATED ART

In recent year, rapidly advancing in various electronic devices represented by a smart phone is lightening, thinning, and downsizing of the devices and an increase in data communication volume. Under the circumstances, further advanced is a printed wiring board that is used in the electronic devices and is compatible with high-frequency waves.

In the printed wiring board, for example, characteristics of used components, a dielectric constant and a dielectric loss of a material used for an insulating substrate, and a way of wiring affect signal transmission speed, a signal waveform, crosstalk, and skew.

The skew particularly indicates a temporal difference in a situation where signals simultaneously transmitted from a data transmitting side through a plurality of signal lines reach a data receiving side at different times. A large temporal difference, i.e., large skew is likely to generate a data transfer error.

Therefore, a technique is being developed that is capable of reducing such skew. For example, PTL 1 discloses a prepreg effective for reducing the skew. In this prepreg, warp or weft of a glass cloth as a reinforcing material is disposed in a curved or inclined manner. Such a disposition enables a plurality of signal lines to be disposed aslant with respect to the warp and the weft, so that it is possible to reduce the skew.

CITATION LIST

Patent Literature

PTL 1: WO 2013/140812

SUMMARY OF THE INVENTION

One of objects to be attained is reduction of crosstalk for providing a printed wiring board compatible with high-frequency waves. The crosstalk is a phenomenon where an electromagnetic wave generated from a signal line adversely affects an adjacent signal line to be a cause of generation of noise. Generally, the crosstalk is considered to be caused due to a large relative dielectric constant of an insulating substrate on which signal lines are formed. Here, the insulating substrate (a cured product of a prepreg) is generally a composite material including a resin and a glass cloth. The relative dielectric constant of the insulating substrate further increases due to a large influence from the glass cloth. Thus, the crosstalk easily occurs.

The present disclosure has been made in view of the points described above, and an object is to provide a prepreg, a metal-clad laminate, a printed wiring board, and a method for producing a prepreg that are capable of reducing the skew and the relative dielectric constant.

A prepreg according to the present disclosure includes a first resin layer and a second resin layer disposed on each of opposite faces of the first resin layer. The first resin layer is a half-cured product of a first resin composition that includes a glass cloth impregnated with the first resin composition and contains no hexagonal boron nitride, and the second resin layer is a half-cured product of a second resin composition containing hexagonal boron nitride. The glass cloth has a warp and weft weave density of 54 pieces/25 mm or more, and the hexagonal boron nitride has an average particle size ranging from 10 μm to 30 μm.

The hexagonal boron nitride is contained in an amount ranging from 20 parts by mass to 40 parts by mass relative to 100 parts by mass of a residual component other than the hexagonal boron nitride in the second resin composition.

The hexagonal boron nitride in the second resin layer is preferably aligned in parallel with the glass cloth in the first resin layer.

A metal-clad laminate according to the present disclosure includes an insulating layer formed of a cured product of the prepreg, and a metal layer disposed on one or both faces of the insulating layer.

A printed wiring board according to the present disclosure includes an insulating layer formed of a cured product of the prepreg, and conductor wiring disposed on one or both faces of the insulating layer.

A method for producing a prepreg according to the present disclosure includes steps of impregnating a glass cloth with a first varnish that includes a first resin composition containing no hexagonal boron nitride; and applying a second varnish that includes a second resin composition containing hexagonal boron nitride to each of opposite faces of the glass cloth that has been impregnated with the first varnish.

The first resin composition is preferably identical with a composition obtained by removing hexagonal boron nitride from the second resin composition.

According to the present disclosure, hexagonal boron nitride interposed between the glass cloth and the conductor wiring in the printed wiring board can decrease an influence from a high dielectric constant of the glass cloth on impedance of the conductor wiring, so that it is possible to reduce the skew and the relative dielectric constant.

DETAILED DESCRIPTION OF THE PREFERRED EMBODIMENTS

Hereinafter, exemplary embodiments of the present disclosure are described.

[Prepreg]

Figure 1:
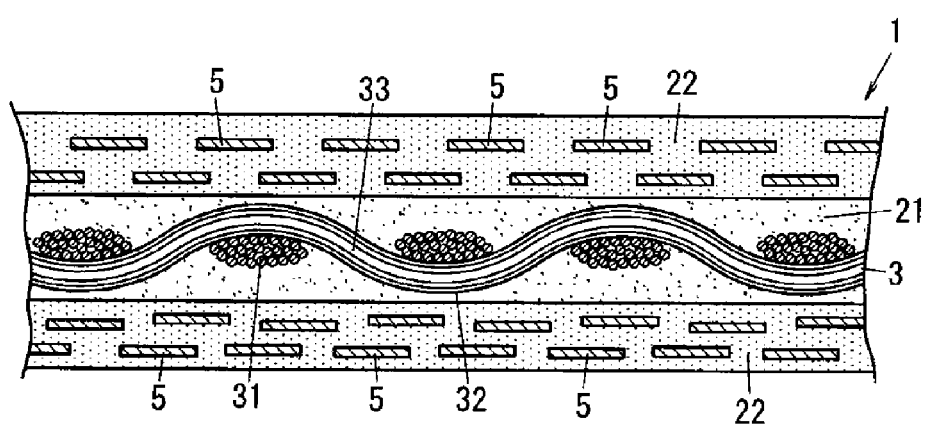
FIG. 1 is a schematic sectional view of a prepreg according to an exemplary embodiment of the present disclosure.

As illustrated in FIG. 1, prepreg 1 according to a present exemplary embodiment includes first resin layer 21 and second resin layer 22. Prepreg 1 is used as a material for printed wiring board 100 (described later). Prepreg 1 is a half-cured product. The half-cured product means a product in a stage between an uncured product and a cured product (completely cured product). Hereinafter, the half-cured product is used in the same meaning. The half-cured product is once melted when heated, and then becomes a cured product.

First, first resin layer 21 is described. First resin layer 21 is a half-cured product of a first resin composition that includes glass cloth 3 impregnated with the first resin composition. As described above, first resin layer 21 includes glass cloth 3. First resin layer 21 has a thickness of at least thickness of glass cloth 3 or more, for example, a thickness ranging from 10 µm to 140 µm.

Figure 2A:
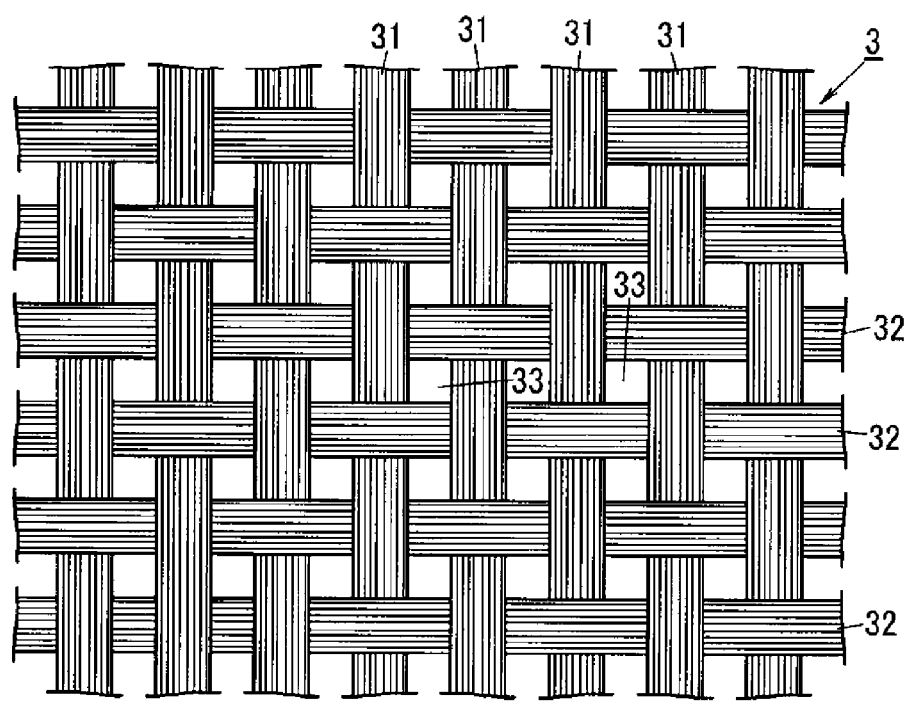
FIG. 2A is a schematic plan view illustrating a first example of a glass cloth that constitutes the prepreg.
Figure 2B:
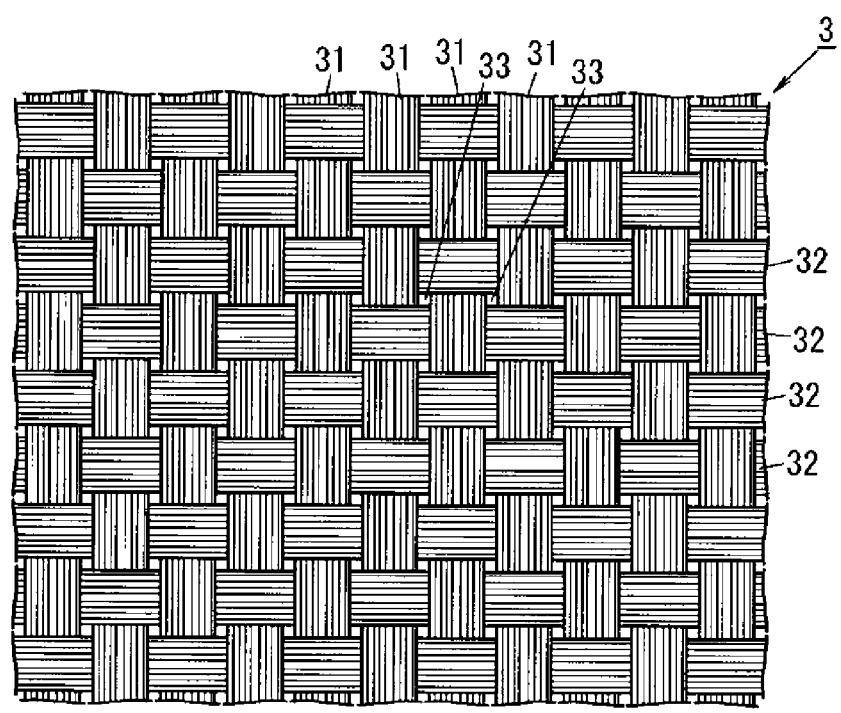
FIG. 2B is a schematic plan view illustrating a second example of the glass cloth that constitutes the prepreg.

Next, glass cloth 3 is described. Glass cloth 3 is used as a reinforcing material of prepreg 1. FIG. 2A illustrates a first example of glass cloth 3, and FIG. 2B illustrates a second example of glass cloth 3. Glass cloth 3 is fabric woven with glass fiber yarn. Specifically, glass cloth 3 is woven fabric, with, for example, twisted yarn of glass filaments having a diameter ranging from 5 µm to 15 µm used as warp 31 and weft 32. A method of weaving glass cloth 3 is, for example, plain weave but is not particularly limited. So-called basket hole 33 is a part surrounded by two pieces of warp 31, 31 next to each other and two pieces of weft 32, 32 next to each other. On a surface of glass cloth 3, a recess is a part where basket hole 33 is present, whereas a protrusion is a part where no basket hole 33 is present (a part where at least either one of warp 31 and weft 32 is present). Thus, glass cloth 3 has a recess and protrusion surface. Glass cloth 3 has a flatter and smoother surface according as basket hole 33 is small. FIG. 2A illustrates glass cloth 3 having large basket hole 33, and FIG. 2B illustrates glass cloth 3 having small basket hole 33. Glass cloth 3 illustrated in FIG. 2B has a flatter and smoother surface than the surface of glass cloth 3 illustrated in FIG. 2A. Basket hole 33 is preferably as small as a particle with a particle size of about 10 µm cannot pass through, and the basket hole is preferred to be smaller. Glass cloth 3 has a thickness ranging from 5 µm to 135 µm, for example.

Glass cloth 3 has a warp and weft weave density of 54 pieces/25 mm or more. The weave density refers to a number of picks per unit length, and the unit length is 25 mm in the present exemplary embodiment. When glass cloth 3 has a density of less than 54 pieces/25 mm for any one of the warp weave density, the weft weave density, and the warp and weft weave density, basket hole 33 becomes large to increase the recess and the protrusion on the surface of glass cloth 3. Such glass cloth 3 may possibly allow hexagonal boron nitride 5 (described later) to fall in basket hole 33 on glass cloth 3.

Next, the first resin composition is described. The first resin composition contains, for example, a thermosetting resin and a curing agent. Specific examples of the thermosetting resin include a dicyclopentadiene epoxy resin, a cresol novolac epoxy resin, and a flame-retardant epoxy resin. The thermosetting resin, however, is not particularly limited. Only one or two or more thermosetting resins may be contained in the first resin composition. Specific examples of the curing agent include a phenolic resin. The curing agent, however, is not particularly limited. The first resin composition may or may not contain a filler. The first resin composition contains no hexagonal boron nitride 5. Therefore, first resin layer 21 formed of the first resin composition contains no hexagonal boron nitride 5. The first resin composition may or may not contain a solvent. Specific examples of the solvent include methyl ethyl ketone. Even when the first resin composition contains a solvent, a cured product of the first resin composition substantially contains no solvent. The first resin composition can be prepared by blending the components described above and stirring a resultant mixture with an appropriate stirrer. Usually, the first resin composition is in a state of a varnish as a stage A, heated to become a half-cured state as a stage B, and further heated to become a cured state as a stage C where the first resin composition is completely cured.

Next, second resin layer 22 is described. Second resin layer 22 is disposed on both surfaces of first resin layer 21. Second resin layer 22 is a half-cured product of a second resin composition. Second resin layer 22 includes no glass cloth 3. Second resin layer 22 has a thickness ranging from 2 µm to 30 µm, for example.

Next, the second resin composition is described. The second resin composition contains, for example, a thermosetting resin and a curing agent. Specific examples of the thermosetting resin include a dicyclopentadiene epoxy resin, a cresol novolac epoxy resin, and a flame-retardant epoxy resin. The thermosetting resin, however, is not particularly limited. Only one or two or more thermosetting resins may be contained in the second resin composition. Specific examples of the curing agent include a phenolic resin. The curing agent, however, is not particularly limited. The second resin composition contains hexagonal boron nitride 5. Therefore, second resin layer 22 formed of the second resin composition contains hexagonal boron nitride 5. Hexagonal boron nitride 5 is a type of filler, and the second resin composition may or may not contain a filler other than hexagonal boron nitride 5. The second resin composition may or may not contain a solvent. Specific examples of the solvent include methyl ethyl ketone. Even when the second resin composition contains a solvent, a cured product of the second resin composition substantially contains no solvent. The second resin composition can be prepared by blending the components described above and stirring a resultant mixture with an appropriate stirrer. Usually, the second resin composition is in a state of a varnish as a stage A, heated to become a half-cured state as a stage B, and further heated to become a cured state as a stage C where the second resin composition is completely cured.

Here, the first resin composition is preferably identical with a composition obtained by removing hexagonal boron nitride 5 from the second resin composition. In other words, a composition obtained by adding hexagonal boron nitride 5 to the first resin composition is preferably the second resin composition. Such an arrangement does not require separate preparation of the first resin composition and the second resin composition. That is, the first resin composition is basically prepared, and an appropriate amount of hexagonal boron nitride 5 can be added as necessary to prepare the second resin composition. Further, when a difference between the first resin composition and the second resin composition is only presence or absence of hexagonal boron nitride 5 and the other components in the first resin composition and the second resin composition are identical, it is possible to improve adhesiveness between first resin layer 21 and second resin layer 22. Next, hexagonal boron nitride 5 is described. Boron nitride has a normal-pressure phase that is hexagonal (h-BN) and a high-pressure phase that is cubic (c-BN). The former normal-pressure phase boron nitride corresponds to hexagonal boron nitride 5 of the present exemplary embodiment. Hexagonal boron nitride 5 is fine ceramics having a layered structure similar to a structure of graphite. In hexagonal boron nitride 5, B atoms and N atoms are alternately bound by covalent bonds to form a six-membered ring, a plurality of the six-membered rings are two-dimensionally connected to form a tabular structure, and further, a plurality of the tabular structures are stacked by a van der Waals bond to form the layered structure. As described above, hexagonal boron nitride 5 has a strong covalent bond in the tabular structure while having a weak van der Waals bond between layers each having the tabular structure, so that hexagonal boron nitride 5 is anisotropic. Due to such anisotropy, hexagonal boron nitride 5 is, similarly to graphite, excellent in lubricity, thermal conductivity, chemical resistance, and thermal stability and is also excellent in electric characteristics (insulation properties and low dielectric constant) differently from graphite. In prepreg 1 according to the present exemplary embodiment, since hexagonal boron nitride 5 has a low dielectric constant as described above, hexagonal boron nitride 5 in second resin layer 22 is capable of shielding an exterior of second resin layer 22 from an influence caused by a high dielectric constant of glass cloth 3 in first resin layer 21.

Hexagonal boron nitride 5 has an average particle size ranging from 10 μm to 30 μm. The average particle size means a particle size at 50% in a distribution (D50: median diameter) obtained through measurement according to a laser diffraction scattering method, and the same applies hereinafter. When hexagonal boron nitride 5 has an average particle size of less than 10 μm, a lot of hexagonal boron nitride 5 may possibly fall in basket holes 33 on glass cloth 3 during production of prepreg 1. Such hexagonal boron nitride 5 that has fallen in basket hole 33 is incapable of sufficiently shielding the exterior of prepreg 1 from the influence caused by the high dielectric constant of glass cloth 3. When hexagonal boron nitride 5 has an average particle size of more than 30 μm, hexagonal boron nitride 5 having a large particle size is likely to be crushed by stir during preparation of the second resin composition or by application of second varnish 92 (described later) during production of prepreg 1, so that hexagonal boron nitride 5 may possibly result in having an average particle size of less than 10 μm. This causes the same problem as described above. Hexagonal boron nitride 5 having an average particle size ranging from 10 μm to 30 μm is less likely to be crushed during preparation of the second resin composition and during production of prepreg 1, so that it is possible to suppress remarkable reduction of the average particle size. As described above, when the average particle size of hexagonal boron nitride 5 at 10 μm or more, it is possible to prevent a lot of hexagonal boron nitride 5 from falling in basket holes 33 on glass cloth 3 during production of prepreg 1. Thus, hexagonal boron nitride 5 in second resin layer 22 is capable of sufficiently shielding the exterior of prepreg 1 from the influence caused by the high dielectric constant of glass cloth 3.

Hexagonal boron nitride 5 is contained in an amount ranging from 20 parts by mass to 40 parts by mass relative to 100 parts by mass of a residual component other than the hexagonal boron nitride in the second resin composition. With hexagonal boron nitride 5 contained in an amount of 20 parts by mass or more, hexagonal boron nitride 5 in second resin layer 22 is capable of sufficiently shielding the exterior of prepreg 1 from the influence caused by the high dielectric constant of glass cloth 3. With hexagonal boron nitride 5 contained in an amount of 40 parts by mass or less, it is possible to secure fluidity of the second resin composition to prevent generation of a void in second resin layer 22.

Hexagonal boron nitride 5 in second resin layer 22 is preferably aligned in parallel with glass cloth 3 in first resin layer 21. Since having the layered structure, hexagonal boron nitride 5 that is aligned in parallel with the surface of glass cloth 3 easily forms a wall that blocks glass cloth 3 from the exterior of second resin layer 22. Thus, hexagonal boron nitride 5 in second resin layer 22 is capable of further effectively shielding the exterior of resin layer 22 from the influence caused by the high dielectric constant of glass cloth 3 in first resin layer 21.

As described above, the first resin composition contains no hexagonal boron nitride 5, so that first resin layer 21 also contains no hexagonal boron nitride 5, in the present exemplary embodiment. If first resin layer 21 contains hexagonal boron nitride 5, hexagonal boron nitride 5 having the layered structure is possibly disposed along the recess and the protrusion on the surface of glass cloth 3. Such a disposition makes a surface of first resin layer 21 into a recess and protrusion surface to possibly inhibit the alignment of hexagonal boron nitride 5 in second resin layer 22. That is, even when hexagonal boron nitride 5 in second resin layer 22 is made to be aligned in parallel with glass cloth 3, such alignment may possibly be inhibited by hexagonal boron nitride 5 in first resin layer 21. For this reason, first resin layer 21 contains no hexagonal boron nitride 5 in the present exemplary embodiment.

[Method for Producing Prepreg]

Figure 3:
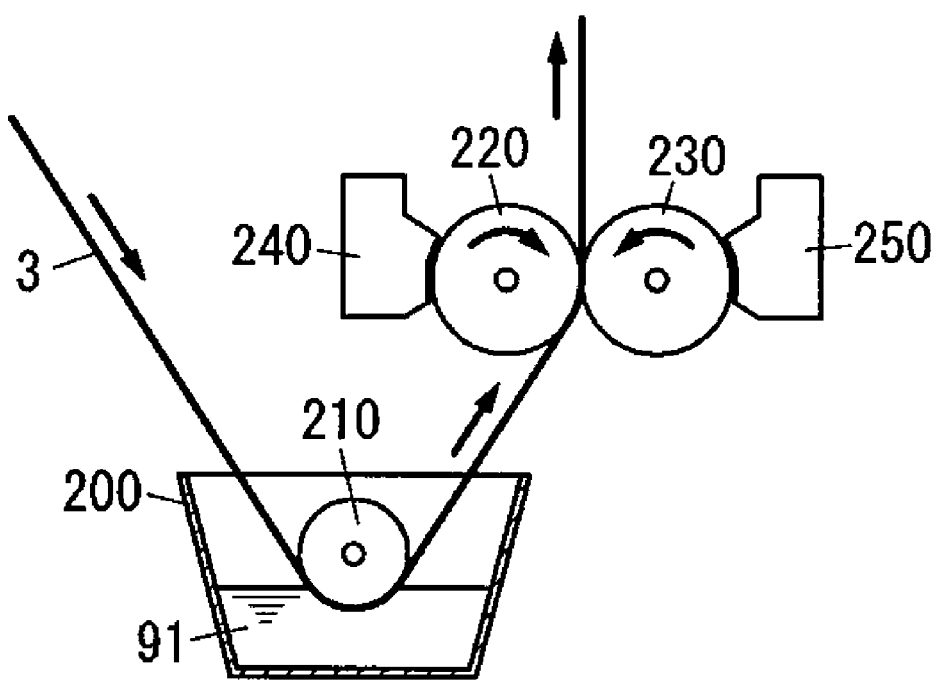
FIG. 3 is a schematic front view illustrating one example of an apparatus for producing the prepreg.

A method for producing prepreg 1 according to a present exemplary embodiment includes a first varnish impregnation step and a second varnish application step. The first varnish impregnation step comes first and the second varnish application step comes next. FIG. 3 illustrates one example of an apparatus for producing prepreg 1 that is appropriate for use in this method. The apparatus for producing prepreg 1 includes impregnation tank 200, first roller 210, two second rollers 220, 230, and two varnish supplying units 240, 250. First roller 210 is disposed in impregnation tank 200. First varnish 91 is retained in impregnation tank 200. At least a part of first roller 210 is sunk in first varnish 91. Two second rollers 220, 230 are disposed above impregnation tank 200. Second rollers 220, 230 are disposed so as to be opposite to each other, with one surface of glass cloth 3, which has been impregnated with first varnish 91, contacted with second roller 220 and the other surface of the glass cloth 3 contacted with second roller 230. Varnish supplying units 240, 250 supply second varnish 92 to second rollers 220, 230, respectively. Specific examples of varnish supplying units 240, 250 include a die coater.

Next, the first varnish impregnation step and the second varnish application step are described.

Figure 4A:
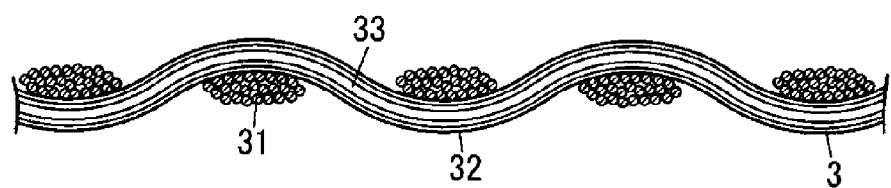
FIG. 4A is a schematic sectional view of the glass cloth that constitutes the prepreg.
Figure 4B:
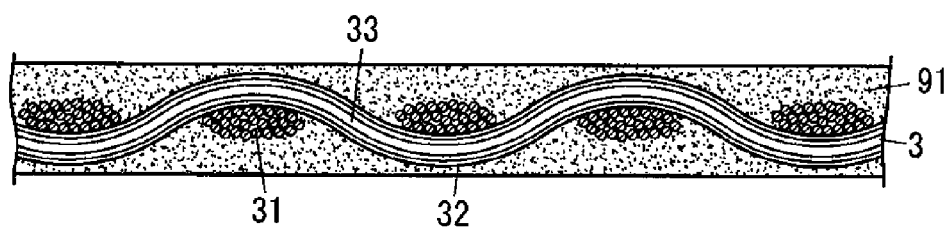
FIG. 4B is a schematic sectional view illustrating the glass cloth that has been impregnated with a first varnish.

First, the first varnish impregnation step is described. In the first varnish impregnation step, glass cloth 3 is impregnated with first varnish 91. First varnish 91 includes a first resin composition. The first resin composition that is liquid may directly be used as first varnish 91. The first resin composition that is even liquid, however, is preferably diluted with a solvent to prepare first varnish 91 for improvement of impregnation properties into glass cloth 3. The first resin composition contains no hexagonal boron nitride 5. Therefore, first varnish 91 also contains no hexagonal boron nitride 5. The impregnation of glass cloth 3 with first varnish 91 is performed by, as illustrated in FIG. 3, allowing glass cloth 3 to enter into impregnation tank 200 and extracting glass cloth 3 to an exterior while turning glass cloth 3 up with first roller 210. Thus, glass cloth 3 is impregnated with first varnish 91. Speed of delivering glass cloth 3 is preferred to be higher without generating a void, from a viewpoint of productivity of prepreg 1. FIG. 4A illustrates glass cloth 3 before impregnation with first varnish 91, and FIG. 4B illustrates glass cloth 3 after impregnation with first varnish 91.

Figure 4C:
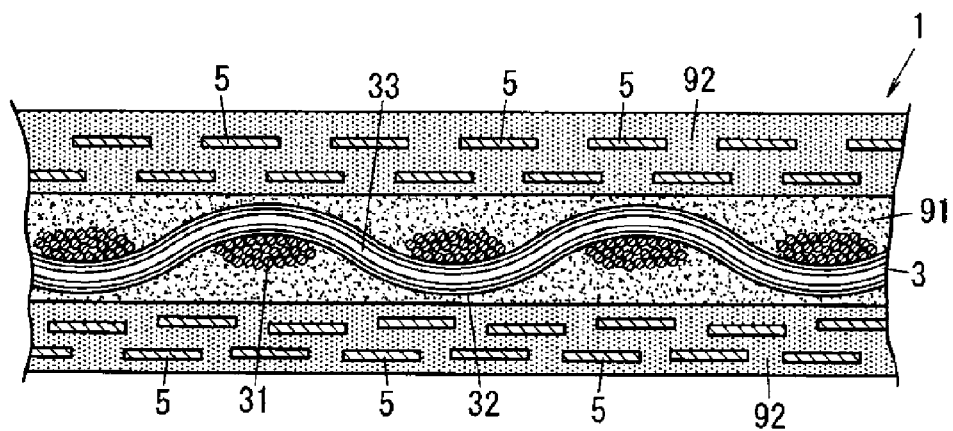
FIG. 4C is a schematic sectional view illustrating the glass cloth to which a second varnish has been further applied.

Next, the second varnish application step is described. In the second varnish application step, second varnish 92 is applied to both surfaces of glass cloth 3 that has been impregnated with first varnish 91. Second varnish 92 includes a second resin composition. The second resin composition that is liquid may directly be used as second varnish 92. The second resin composition that is even liquid, however, is preferably diluted with a solvent to prepare second varnish 92 for easy application. The second resin composition contains hexagonal boron nitride 5. Therefore, second varnish 92 also contains hexagonal boron nitride 5. Application of second varnish 92 is performed by, as illustrated in FIG. 3, extracting glass cloth 3 from impregnation tank 200 and allowing glass cloth 3 that has been impregnated with first varnish 91 to pass through between second rollers 220, 230. Second varnish 92 is supplied to second rollers 220, 230 by varnish supplying units 240, 250, respectively, and applied by second rollers 220, 230 to both surfaces of glass cloth 3 that has been impregnated with first varnish 91. Application of second varnish 92 described above facilitates the alignment of hexagonal boron nitride 5 in parallel with glass cloth 3. FIG. 4C illustrates glass cloth 3 after application of second varnish 92.

Glass cloth 3 that has been impregnated with first varnish 91 and to both surfaces of which second varnish 92 has been applied as described above is heated by allowing glass cloth 3 to pass through a heating furnace after the second varnish application step. The heating furnace is not limited as long as the heating furnace is a non-contact heating unit. Heating conditions are not particularly limited as long as first resin layer 21 is formed from first varnish 91 and second resin layer 22 is formed from second varnish 92. For example, temperature ranges from 80° C. to 200° C., and time ranges from 3 minutes to 20 minutes. When first varnish 91 and second varnish 92 contain a solvent, the solvent is removed by heating. First varnish 91 that includes the first resin composition is heated to half-cure the first resin composition and thus form first resin layer 21. Second varnish 92 that includes the second resin composition is heated to half-cure the second resin composition and thus form second resin layer 22. Thus, prepreg 1 illustrated in FIG. 1 can be produced.

[Metal-Clad Laminate]

Figure 5:
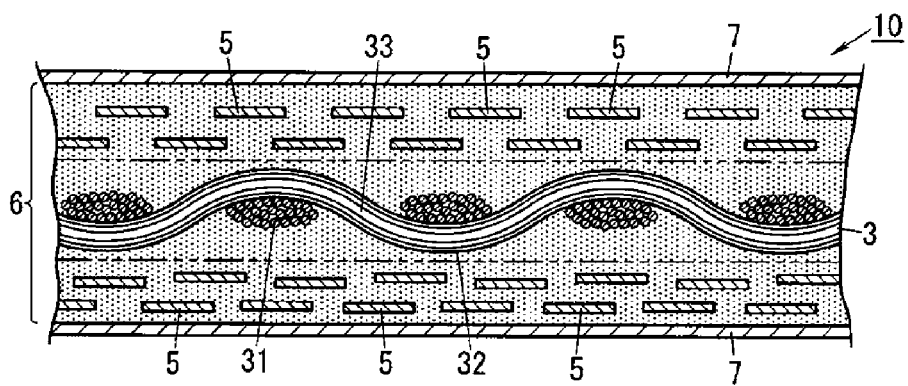
FIG. 5 is a schematic sectional view of a metal-clad laminate according to an exemplary embodiment of the present disclosure.

As illustrated in FIG. 5, metal-clad laminate 10 according to a present exemplary embodiment includes insulating layer 6 and metal layer 7.

Insulating layer 6 is formed of a cured product of prepreg 1. The cured product of prepreg 1 includes a cured product of first resin layer 21 including glass cloth 3 and a cured product of second resin layer 22. Insulating layer 6 is electrically insulative.

In FIG. 5, insulating layer 6 is formed of a cured product of one prepreg 1. In this case, insulating layer 6 includes one glass cloth 3. Although not illustrated in the drawing, insulating layer 6 may be formed of a cured product of two or more stacked prepregs 1. In this case, insulating layer 6 includes two or more glass cloths 3. In either of these cases, hexagonal boron nitride 5 in insulating layer 6 is capable of shielding an exterior of insulating layer 6 from an influence caused by a high dielectric constant of glass cloth 3 in insulating layer 6.

Metal layer 7 is disposed on one or both surfaces of insulating layer 6. Metal layer 7 is disposed on an entire surface of insulating layer 6. That is, metal layer 7 has the same area as an area of insulating layer 6 but does not need to have exactly the same area. When metal layer 7 is disposed on one surface of insulating layer 6, metal-clad laminate 10 is a metal-clad laminate one surface of which is clad with a metal. When metal layer 7 is disposed on both surfaces of insulating layer 6, metal-clad laminate 10 is a metal-clad laminate both surfaces of which are clad with a metal. Specific examples of metal layer 7 include a metal foil and plating. Specific examples of a material for metal layer 7 include copper. Metal layer 7 has a thickness ranging from 1 μm to 140 μm, for example.

Metal-clad laminate 10 can be produced by heating and pressing prepreg 1 on one or both surfaces of which a metal foil is stacked. In this case, one prepreg 1 may be used, or two or more prepregs 1 may be used. That is, metal-clad laminate 10 may be produced by stacking a metal foil on one or both surfaces of a stacked body obtained by stacking two or more prepregs 1 and heating and pressing the stacked body. When the metal foil is stacked, a mat surface of the metal foil is preferably stacked on prepreg 1 to improve adhesion. Heating and pressing conditions are not particularly limited as long as insulating layer 6 is formed of first resin layer 21 and second resin layer 22. For example, temperature ranges from 130° C. to 220° C., time ranges from 30 minutes to 360 minutes, and pressure ranges from 0.9 MPa to 3.9 MPa (10 kgf/cm$^2$ to 40 kgf/cm$^2$).

[Printed Wiring Board]

Figure 6:
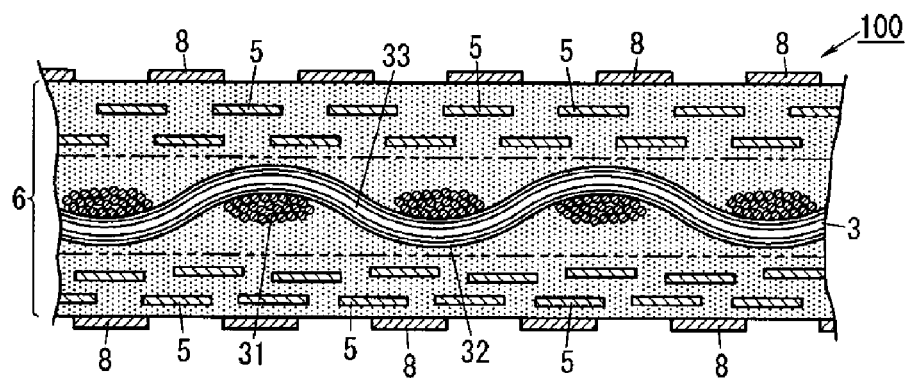
FIG. 6 is a schematic sectional view of a printed wiring board according to an exemplary embodiment of the present disclosure.

As illustrated in FIG. 6, printed wiring board 100 according to a present exemplary embodiment includes insulating layer 6 and conductor wiring 8.

Insulating layer 6 is formed of a cured product of prepreg 1. The cured product of prepreg 1 includes a cured product of first resin layer 21 including glass cloth 3 and a cured product of second resin layer 22. Insulating layer 6 is electrically insulative.

In FIG. 6, insulating layer 6 is formed of a cured product of one prepreg 1. In this case, insulating layer 6 includes one glass cloth 3. Although not illustrated in the drawing, insulating layer 6 may be formed of a cured product of two or more stacked prepregs 1. In this case, insulating layer 6 includes two or more glass cloths 3. In either of these cases, hexagonal boron nitride 5 in insulating layer 6 is capable of shielding conductor wiring 8 from the influence caused by the high dielectric constant of glass cloth 3 in insulating layer 6.

Conductor wiring 8 is disposed on one or both surfaces of insulating layer 6. For example, conductor wiring 8 can be formed by removing an unnecessary portion of metal layer 7 in metal-clad laminate 10 by etching according to a subtractive method. Alternatively, conductor wiring 8 may be formed on an unclad laminate according to an additive method. Here, the unclad laminate means a substrate only formed of insulating layer 6 without metal layer 7. Since hexagonal boron nitride 5 in insulating layer 6 shields conductor wiring 8 from the influence caused by the high dielectric constant of glass cloth 3 in insulating layer 6, a location for forming conductor wiring 8 is not particularly restricted on a surface of insulating layer 6, and conductor wiring 8 can be freely led around and formed. That is, circuit design is made with high degree of freedom.

Hexagonal boron nitride 5 interposed between glass cloth 3 and conductor wiring 8 in printed wiring board 100 can decrease an influence from a high dielectric constant of glass cloth 3 on impedance of conductor wiring 8, so that it is possible to reduce the skew and the relative dielectric constant. Thus, printed wiring board 100 according to the present exemplary embodiment is suitable for high speed signal transmission.

EXAMPLES

Hereinafter, the invention according to the present disclosure is specifically described by way of examples.
[Prepreg]
Materials used for producing a prepreg are as follows.
(First Resin Composition)
<Thermosetting Resin>
Dicyclopentadiene epoxy resin ("EPICLON HP-7200" DIC Corporation, epoxy equivalent: 254 g/eq to 264 g/eq)
Cresol novolac epoxy resin ("EPICLON N-690" DIC Corporation, epoxy equivalent: 209 g/eq to 219 g/eq)
Flame-retardant epoxy resin ("EPICLON 153" DIC Corporation, epoxy equivalent: 390 g/eq to 410 g/eq, content of bromine: 46% by mass to 50% by mass)
<Curing Agent>
Phenolic resin ("MEH-7851" Meiwa Plastic Industries, Ltd.)
(First Varnish)
A thermosetting resin and a curing agent of the first resin composition in amounts indicated in Table 1 were dissolved in a solvent (methyl ethyl ketone). In the dissolution, an amount of the solvent was adjusted so that the thermosetting resin and the curing agent accounted for 70% by mass of an entire solution obtained. Then, the solution was stirred with a dispersing tool for two hours to prepare a first varnish.
(Second Resin Composition)
<Thermosetting Resin>
Same as in first resin composition
<Curing Agent>
Same as in first resin composition
<Filler>
Hexagonal boron nitride ("XGP" Denka Company Limited, average particle size: 30 μm)
Hexagonal boron nitride ("MGP" Denka Company Limited, average particle size: 10 μm)
Hexagonal boron nitride ("GP" Denka Company Limited, average particle size: 7 μm)
(Second Varnish)
A thermosetting resin and a curing agent of the second resin composition in amounts indicated in Table 1 were dissolved in a solvent (methyl ethyl ketone). In the dissolution, an amount of the solvent was adjusted so that the thermosetting resin and the curing agent accounted for 70% by mass of an entire solution obtained. Then, the solution was stirred with a dispersing tool for two hours, a filler was added in an amount indicated in Table 1, and the solution was further stirred with the dispersing tool for two hours to prepare a second varnish.
(Glass Cloth)
Glass cloths manufactured by NITTO BOSEKI CO., LTD. were used. Product numbers of the glass cloths are described below.

Hereinafter, an expression, for example, "weave density: 54×54" means that warp weave density is 54 pieces/25 mm and weft weave density is 54 pieces/25 mm.
Product No. "1078" (weave density: 54×54)
Product No. "1037" (weave density: 70×72)
Product No. "1037" (weave density: 70×73)
Product No. "1080" (weave density: 60×47)
Product No. "7628" (weave density 44×31)

Using the materials described above, a prepreg was produced by the apparatus for producing a prepreg illustrated in FIG. 3. That is, in the first varnish impregnation step, a glass cloth was impregnated with the first varnish at room temperature. Next, in the second varnish application step, the second varnish was at room temperature applied to both surfaces of the glass cloth that had been impregnated with the first varnish. Subsequently, the glass cloth that had been impregnated with the first varnish and to which the second varnish had been applied was allowed to pass through a heating furnace, thus heating the glass cloth at 170° C. for 5 minutes to produce a prepreg.
[Metal-Clad Laminate]
A metal-clad laminate was produced by heating and pressing a prepreg on both surfaces of which a metal foil was stacked. In this process, two or more prepregs were stacked as necessary so that thickness of a prepreg portion ranged from 100 μm to 800 μm. As the metal foil, a copper foil ("3EC-III" MITSUI MINING & SMELTING CO., LTD., thickness: 35 μm) was used. When the metal foil was stacked, a mat surface of the metal foil was stacked on the surfaces of the prepreg. As heating and pressing conditions, temperature was 170° C., time was 60 minutes, and pressure was 2.9 MPa (30 kgf/cm$^2$).

Among metal-clad laminates obtained as described above, a metal-clad laminate that had a thickness ranging from 120 μm to 270 μm was evaluated for moldability, a metal-clad laminate that had a thickness ranging from 770 μm to 870 μm was used for measurement of a relative dielectric constant, and a metal-clad laminate that had a thickness ranging from 170 μm to 200 μm was used for measurement of skew.
[Moldability]
The metal foils of the metal-clad laminate were removed by etching. A remaining insulating layer (thickness ranging from 50 μm to 200 μm) was cut, and a resultant cross-section was observed. The moldability was evaluated by presence or absence of a void in the insulating layer. One having no void was determined as good moldability "○" and one having a void was determined as bad moldability "×."
[Relative Dielectric Constant]
The metal foils of the metal-clad laminate were removed by etching. A remaining insulating layer (thickness ranging from 700 μm to 800 μm) was measured for the relative dielectric constant at 1 GHz using an impedance analyzer ("E4991B" manufactured by KEYSIGHT TECHNOLOGIES) according to a procedure in IPC-TM650-2.5.5.9. The relative dielectric constant means a relative dielectric constant of the entire insulating layer including the glass cloth.
[Skew]
Only one surface of the metal-clad laminate was etched to form 5 pieces of conductor wiring having a circuit length of 10 cm. On the surface on which these pieces of conductor wiring were formed, a prepreg and a metal foil were stacked in that order and were heated and pressed to produce a three-layered printed wiring board. In this process, two or more prepregs were stacked as necessary so that thickness of a prepreg portion after molding ranged from 130 μm to 160 μm. As the metal foil, a copper foil ("3EC-III" MITSUI MINING & SMELTING CO., LTD., thickness: 35 μm) was used. When the metal foil was stacked, a mat surface of the metal foil was stacked on a surface of the prepreg. As heating and pressing conditions, temperature was 170° C., time was 60 minutes, and pressure was 2.9 MPa (30 kgf/cm$^2$). The three layers of the printed wiring board consist of two layers as the metal foils on both surfaces and one layer as the conductor wiring between the insulating layers. The printed wiring board had a thickness ranging from 300 μm to 370 μm including thickness of the metal foils on both surfaces of the printed wiring board.

The printed wiring board obtained as described above was used to measure transmission speed of the 5 pieces of conductor wiring (impedance: 50Ω), and a difference between a maximum value and a minimum value was determined as the skew.

TABLE 1

| | | Product No. | Unit | Example 1 | Example 2 | Example 3 | Example 4 | Example 5 |
|---|---|---|---|---|---|---|---|---|
| First resin composition | Thermosetting resin | HP-7200 | g | 9.3 | 9.3 | 9.3 | 9.3 | 9.3 |
| | | N-690 | g | 18.5 | 18.5 | 18.5 | 18.5 | 18.5 |
| | | EPICLON 153 | g | 27.8 | 27.8 | 27.8 | 27.8 | 27.8 |
| | Curing agent | MEH-7851 | g | 44.4 | 44.4 | 44.4 | 44.4 | 44.4 |
| Second resin composition | Thermosetting resin | HP7200 | g | 9.3 | 9.3 | 9.3 | 9.3 | 9.3 |
| | | N-690 | g | 18.5 | 18.5 | 18.5 | 18.5 | 18.5 |
| | | EPICLON 153 | g | 27.8 | 27.8 | 27.8 | 27.8 | 27.8 |
| | Curing agent | MEH-7851 | g | 44.4 | 44.4 | 44.4 | 44.4 | 44.4 |
| | Filler | XGP (30 μm) | g | 20 | 40 | 0 | 0 | 0 |
| | | MGP (10 μm) | g | 0 | 0 | 20 | 40 | 20 |
| | | GP (7 μm) | g | 0 | 0 | 0 | 0 | 0 |
| Glass cloth | Product No. | | — | 1078 | 1078 | 1078 | 1078 | 1037 |
| | Weave density (warp (pieces/25 mm) × weft (pieces/25 mm)) | | | 54 × 54 | 54 × 54 | 54 × 54 | 54 × 54 | 70 × 72 |
| Evaluation item | Moldability | Appearance after molding | — | ○ | ○ | ○ | ○ | ○ |
| | Relative dielectric constant | IPC 2.5.5.9 | — | 4.0 | 3.8 | 4.0 | 3.9 | 4.1 |
| | Skew (difference between maximum value and minimum value) | | sec | $5.0 \times 10^{-6}$ | $4.0 \times 10^{-6}$ | $6.2 \times 10^{-6}$ | $5.2 \times 10^{-6}$ | $9.0 \times 10^{-6}$ |

| | | Product No. | Unit | Comparative Example 1 | Comparative Example 2 | Comparative Example 3 |
|---|---|---|---|---|---|---|
| First resin composition | Thermosetting resin | HP-7200 | g | 9.3 | 9.3 | 9.3 |
| | | N-690 | g | 18.5 | 18.5 | 18.5 |
| | | EPICLON 153 | g | 27.8 | 27.8 | 27.8 |
| | Curing agent | MEH-7851 | g | 44.4 | 44.4 | 44.4 |
| Second resin composition | Thermosetting resin | HP7200 | g | 9.3 | 9.3 | 9.3 |
| | | N-690 | g | 18.5 | 18.5 | 18.5 |
| | | EPICLON 153 | g | 27.8 | 27.8 | 27.8 |
| | Curing agent | MEH-7851 | g | 44.4 | 44.4 | 44.4 |
| | Filler | XGP (30 μm) | g | 10 | 50 | 0 |
| | | MGP (10 μm) | g | 0 | 0 | 0 |
| | | GP (7 μm) | g | 0 | 0 | 20 |
| Glass cloth | Product No. | | — | 1078 | 1078 | 1037 |
| | Weave density (warp (pieces/25 mm) × weft (pieces/25 mm)) | | | 54 × 54 | 54 × 54 | 70 × 73 |
| Evaluation item | Moldability | Appearance after molding | — | ○ | x | ○ |
| | Relative dielectric constant | IPC 2.5.5.9 | — | 4.2 | Unmeasurable | 4.0 |
| | Skew (difference between maximum value and minimum value) | | sec | $8.0 \times 10^{-6}$ | Unmeasurable | $1.2 \times 10^{-5}$ |

| | | Product No. | Unit | Comparative Example 4 | Comparative Example 5 | Comparative Example 6 |
|---|---|---|---|---|---|---|
| First resin composition | Thermosetting resin | HP-7200 | g | 9.3 | 9.3 | 9.3 |
| | | N-690 | g | 18.5 | 18.5 | 18.5 |
| | | EPICLON 153 | g | 27.8 | 27.8 | 27.8 |
| | Curing agent | MEH-7851 | g | 44.4 | 44.4 | 44.4 |
| Second resin composition | Thermosetting resin | HP7200 | g | 9.3 | 9.3 | 9.3 |
| | | N-690 | g | 18.5 | 18.5 | 18.5 |
| | | EPICLON 153 | g | 27.8 | 27.8 | 27.8 |
| | Curing agent | MEH-7851 | g | 44.4 | 44.4 | 44.4 |
| | Filler | XGP (30 μm) | g | 0 | 40 | 40 |
| | | MGP (10 μm) | g | 0 | 0 | 0 |
| | | GP (7 μm) | g | 40 | 0 | 0 |
| Glass cloth | Product No. | | — | 1037 | 1080 | 7628 |
| | Weave density (warp (pieces/25 mm) × weft (pieces/25 mm)) | | | 70 × 73 | 60 × 47 | 44 × 31 |

TABLE 1-continued

| Evaluation item | Moldability | Appearance after molding | — | ○ | ○ | ○ |
|---|---|---|---|---|---|---|
| | Relative dielectric constant | IPC 2.5.5.9 | — | 3.9 | 3.8 | 4.2 |
| | Skew (difference between maximum value and minimum value) | | sec | $1.1 \times 10^{-5}$ | $1.0 \times 10^{-5}$ | $1.4 \times 10^{-5}$ |

As is clear from Table 1, Examples 1 to 5 demonstrated that it is possible to reduce the skew and the relative dielectric constant. Examples 1 to 5 that had a small relative dielectric constant are considered to be capable of suppressing generation of crosstalk.

In contrast, Comparative Example 1 that had an excessively small content of hexagonal boron nitride is considered to increase the relative dielectric constant and is thus likely to generate crosstalk.

Comparative Example 2 that had an excessively large content of hexagonal boron nitride deteriorated the moldability and could not be measured for the skew and the relative dielectric constant.

Comparative Examples 3 and 4 demonstrated that it is impossible to reduce the skew with hexagonal boron nitride having an excessively small or large average particle size.

Comparative Examples 5 and 6 demonstrated that it is impossible to reduce the skew with the glass cloth having an excessively small weave density. One reason of this result is, for example, that hexagonal boron nitride fell in basket holes on the glass cloth.

The present disclosure can provide a printed wiring board having reduced skew and a reduced relative dielectric constant and is therefore useful.

The invention claimed is:

1. A prepreg comprising:
a first resin layer; and
a second resin layer disposed on each of opposite faces of the first resin layer,
wherein
the first resin layer is a half-cured product of a first thermosetting resin composition that includes a glass cloth impregnated with the first thermosetting resin composition and contains no hexagonal boron nitride,
the second resin layer is a half-cured product of a second thermosetting resin composition containing hexagonal boron nitride,
the glass cloth has a warp and weft weave density of 54 pieces/25 mm or more,
the hexagonal boron nitride has an average particle size ranging from 10 μm to 30 μm, and
the hexagonal boron nitride is contained in an amount ranging from 20 parts by mass to 40 parts by mass relative to 100 parts by mass of a residual component other than the hexagonal boron nitride in the second thermosetting resin composition.

2. The prepreg according to claim 1, wherein the hexagonal boron nitride in the second resin layer is aligned in parallel with the glass cloth in the first resin layer.

3. A metal-clad laminate comprising:
an insulating layer formed of a cured product of the prepreg according to claim 1; and
a metal layer disposed on one or both surfaces of the insulating layer.

4. A printed wiring board comprising:
an insulating layer formed of a cured product of the prepreg according to claim 1; and
conductor wiring disposed on one or both surfaces of the insulating layer.

5. A method for producing the prepreg according to claim 1, the method comprising steps of:
impregnating the glass cloth with a first varnish comprising the first thermosetting resin composition;
applying a second varnish comprising the second thermosetting resin composition to both surfaces of the glass cloth that has been impregnated with the first varnish; and
heating to half-cure the first thermosetting resin composition and the second thermosetting resin composition.

6. The method according to claim 5, wherein the first thermosetting resin composition is identical to a composition obtained by removing the hexagonal boron nitride from the second thermosetting resin composition.

* * * * *